United States Patent [19]
Belcher

[11] Patent Number: 5,789,927
[45] Date of Patent: Aug. 4, 1998

[54] BASEBAND MEASUREMENT OF RF POWER AMPLIFIER DISTORTION

[75] Inventor: Donald K. Belcher, Rogersville, Tenn.

[73] Assignee: Spectrian, Sunnyvale, Calif.

[21] Appl. No.: 672,576

[22] Filed: Jun. 28, 1996

[51] Int. Cl.[6] .............................. G01R 23/20; H03G 3/20
[52] U.S. Cl. .................... 324/622; 324/620; 324/76.78; 330/2
[58] Field of Search .............................. 324/612, 620, 324/622, 76.74, 76.77, 76.78, 76.79; 330/2

[56] References Cited

U.S. PATENT DOCUMENTS

| | | | |
|---|---|---|---|
| 3,781,669 | 12/1973 | Dick | 324/622 |
| 4,792,751 | 12/1988 | Blumenkranz et al. | 324/620 |
| 5,381,108 | 1/1995 | Whitmarsh et al. | 330/2 |
| 5,394,120 | 2/1995 | Sakamoto et al. | 330/2 |
| 5,561,395 | 10/1996 | Melton et al. | 330/2 |

*Primary Examiner*—Glenn W. Brown
*Attorney, Agent, or Firm*—Charles E. Wands

[57] ABSTRACT

An RF power amplifier distortion measurement system measures amplitude and phase distortion of a microwave/RF power amplifier by phase quadrature down-conversion of each of an RF amplifier's input signal and amplified output signals to baseband in-phase (I) and quadrature (Q) components, and performing RF amplifier distortion measurements on these down-converted baseband I and Q signals. The derived error measurement signal is remodulated to RF by phase quadrature up-conversion circuitry to produce an up-converted RF signal that corresponds to the RF distortion component contained in the RF output signal produced by the RF power amplifier.

20 Claims, 4 Drawing Sheets

BASEBAND MEASUREMENT OF RF POWER AMPLIFIER DISTORTION

FIELD OF THE INVENTION

The present invention relates in general to communication systems, and is particularly directed to an RF power amplifier distortion measurement system and associated method for measuring amplitude and phase distortion of a microwave/RF power amplifier, by down-converting each of an RF amplifier's input signal and amplified output signals to baseband in-phase (I) and quadrature (Q) components, and performing RF amplifier distortion measurements on these down-converted baseband I and Q signals using reduced cost and complexity baseband signal processing components.

BACKGROUND OF THE INVENTION

RF/microwave power amplifiers are known to exhibit distortion-introducing behavior that results in unwanted degradation of the amplified output RF signal. This distortion-introducing behavior of an RF power amplifier diagrammatically illustrated at 10 in FIG. 1 may be represented by an RF error signal component E, which accompanies the amplified RF output signal KS produced by the RF power amplifier 10, amplifier 10 having a gain of K to which an original RF input signal S is applied. The distortion-introducing behavior of the RF power amplifier 10 that produces the error signal component E can be considered as amplifier non-linearities, causing intermodulation products, which are undesirable in multi-carrier applications, and/or dispersion, that is undesirable in wideband signals, such as time division multiple access (TDMA), code division multiple access (CDMA), etc.

One conventional technique to extract the RF error signal component E involves the use of a conventional feedforward RF amplifier configuration, as diagrammatically illustrated in FIG. 2, in which a (1/K) fractional portion of the RF amplifier's output signal is derived by a (1/K) scaling circuit 12 and compared in a subtractor 14 with the input signal, so as to derive a fractional error signal $-E/K$ representative of the distortion introduced by the RF power amplifier. A fundamental drawback to this basic RF feedforward approach is the fact that not only are the RF signal processing components expensive, but the subtraction operation requires precise alignment of RF phase and amplitude components of the RF power amplifier's RF input and scaled RF output signals.

FIG. 3 diagrammatically illustrates an initial attempt by the inventor of the subject matter of the present invention to reduce the complexity and enhanced distortion problems of conducting RF amplifier measurements exclusively at RF frequencies, in which we tried applying the conventional feedforward RF approach of FIG. 2 to baseband, using a coherent receiver 20 to derive respective phase and amplitude error components. In the proposed scheme of FIG. 2, the input signal S to the RF power amplifier 10 is shown as being fed forward to a first hard limiter 21 and to a first input 22 of a first multiplier/mixer 23, while the scaled RF output signal S+E/K produced by RF amplifier 10 is coupled to a second hard limiter 31 and to a first input 32 of a second multiplier/mixer 33. The output 24 of the first hard limiter 21 is coupled to a first input 41 of a third multiplier/mixer 42 and to a second input 25 of the first multiplier/mixer 23.

Similarly, the output 34 of the second hard limiter 31 is coupled to a second input 43 of third multiplier/mixer 42 and to a second input 35 of the second multiplier/mixer 33. The output 26 of the first multiplier/mixer 23 and the output 36 of the second multiplier/mixer, which ideally contain only amplitude information, are applied to complementary inputs 51 and 52 of a difference amplifier 53, to derive an output 54 representative of the amplitude error component of the scaled RF error signal E. The output 44 of the third multiplier/mixer which multiplies the limited versions of the input and scaled output RF signals is ideally representative of the phase error components of the scaled RF error signal E.

Unfortunately, the characteristics of the limiter components 21 and 31, which operate at RF frequencies, are such that variations in the amplitude of their respective input signals S and S+E/K cause the introduction of additional phase distortion separate from that contained in the RF amplifier's output signal KS+E. As a consequence, we found that the proposed scheme of FIG. 2, was not an adequate solution to the problem.

SUMMARY OF THE INVENTION

In accordance with the present invention, the added distortion and component cost/complexity problems of the proposals described above, including both the prior art scheme of FIG. 2, and our previous baseband attempt of FIG. 3, are effectively obviated by a successful baseband down-conversion technique which entails the use of components that exhibit neither phase nor amplitude distortion behavior, in the course of converting the RF signals of interest (S and KS+E) to a lower frequency portion of the electromagnetic spectrum (baseband), so as to allow for the use of reduced cost, and relatively linear (baseband) signal processing components, and performing RF amplifier distortion measurements directly on the down-converted baseband signals.

For this purpose, the baseband-referenced RF power amplifier distortion measurement system in accordance with a first embodiment of the present invention includes input and output signal ports coupled to receive the RF input and amplified output signals of an RF/microwave power amplifier whose distortion-introducing behavior is to be measured. The input signal is downconverted to baseband by way of a first quadrature downconverter producing in-phase and quadrature-phase outputs representative of the instantaneous amplitude and phase of a downconverted-to-baseband version of the input signal. The RF output signal is scaled by a gain/phase adjusting circuit and downconverted to baseband by way of a second quadrature downconverter producing in-phase and quadrature-phase outputs representative of the instantaneous amplitude and phase of a downconverted-to-baseband version of the scaled RF output signal.

The in-phase component of the baseband converted input signal and the in-phase component of the baseband converted output signal are applied to an in-phase difference amplifier, which produces an output representative of the in-phase component of the baseband-converted version of the error or distortion signal E produced by the RF power amplifier. The quadrature-phase component of the baseband converted input signal and the quadrature-phase component of the baseband converted output signal are applied to a second, quadrature-phase difference amplifier, which produces an output representative of the quadrature-phase component of the baseband-converted, 1/K scaled version of the error or distortion signal E produced by the RF power amplifier.

The outputs of the two difference amplifiers are respectively representative of the differences between the in-phase and quadrature components of the RF amplifier's input and (1/K scaled) output signals, so that these difference I and Q outputs represent the scaled error signal E. A baseband correlator is operative to correlate this scaled error signal with the original input signal. The presence of any residual portion of the input signal can be measured, and used as a control signal for setting the parameters of a gain/phase adjusting circuit, so that the scaling constant may be set to a value that will exactly remove the residual signal. This will enable the difference amplifiers to produce I and Q difference outputs that exactly represent a baseband version of the scaled error signal component.

The baseband I difference output of the in-phase difference amplifier and the baseband Q difference output of the quadrature-phase difference amplifier, which contain only the scaled error signal component are further coupled to a quadrature modulator/up-converter, which produces an up-converted or remodulated RF signal that corresponds to the RF error component E of the RF output signal produced by the RF power amplifier. The output of the up-converter is coupled through an error amplifier to produce the desired error signal.

In accordance with a second, digital implementation of a baseband-referenced RF power amplifier distortion measurement system in accordance with an embodiment of the present invention, a digital signal processor performs the respective differencing and correlation functions carried out by the difference amplifiers and the baseband correlator of the first embodiment of the invention. In addition, digitally quantized I and Q values of the baseband-converted output signal generated by the RF power amplifier are controllably scaled (normalized) prior to digital signal processing.

DETAILED DESCRIPTION

Figure 1:
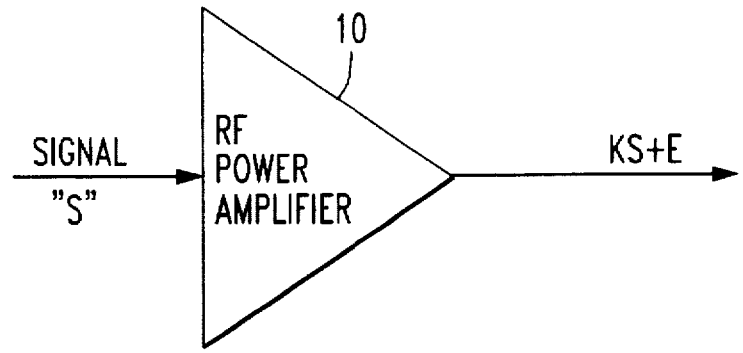
FIG. 1 diagrammatically illustrates an RF/microwave power amplifier whose inherent distortion-introducing behavior results in degradation of the amplified output RF signal.

As pointed out briefly above, the RF power amplifier distortion measurement system and method of the present invention employ a baseband down-conversion scheme, using communication components that exhibit neither phase nor amplitude distortion behavior, in the course of converting the RF signals of interest (S and KS+E) to baseband I and Q signals, thereby allowing the use of reduced cost, and relatively linear baseband signal processing components that perform RF amplifier distortion measurements directly on the down-converted baseband I and Q signals.

Before describing the details of such a baseband-operating RF power amplifier distortion measurement system, however, it should be observed that the present invention resides primarily in what is effectively a prescribed arrangement of conventional communication and signal processing hardware and attendant control circuitry therefor. Consequently, the configuration of the system components and the manner in which they are interfaced with other communication circuitry have been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the system in a convenient functional grouping, whereby the present invention may be more readily understood.

Figure 2:
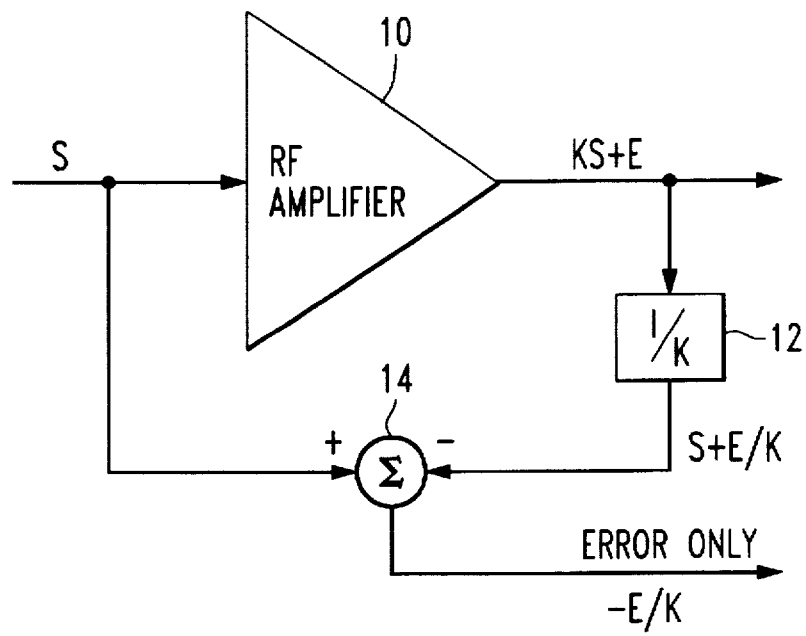
FIG. 2 diagrammatically illustrates a conventional feed-forward technique to extract an RF error signal component from the output signal produced by an RF/microwave power amplifier.
Figure 3:
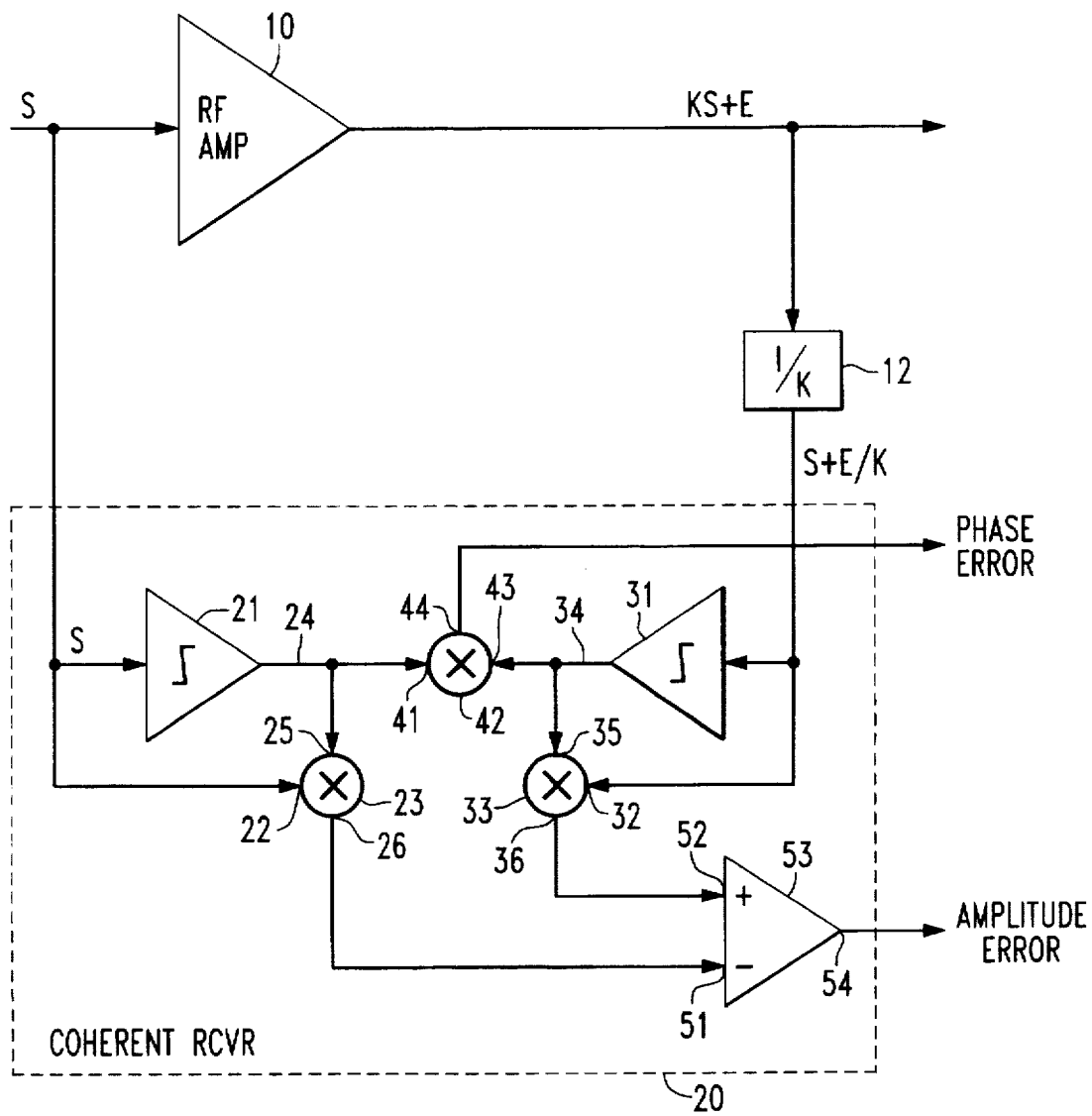
FIG. 3 diagrammatically illustrates an initial attempt by the present inventors to reduce the complexity and enhanced distortion problems of conducting RF amplifier measurements exclusively at RF frequencies, by using a coherent receiver to derive respective baseband phase and amplitude error signals.
Figure 4:
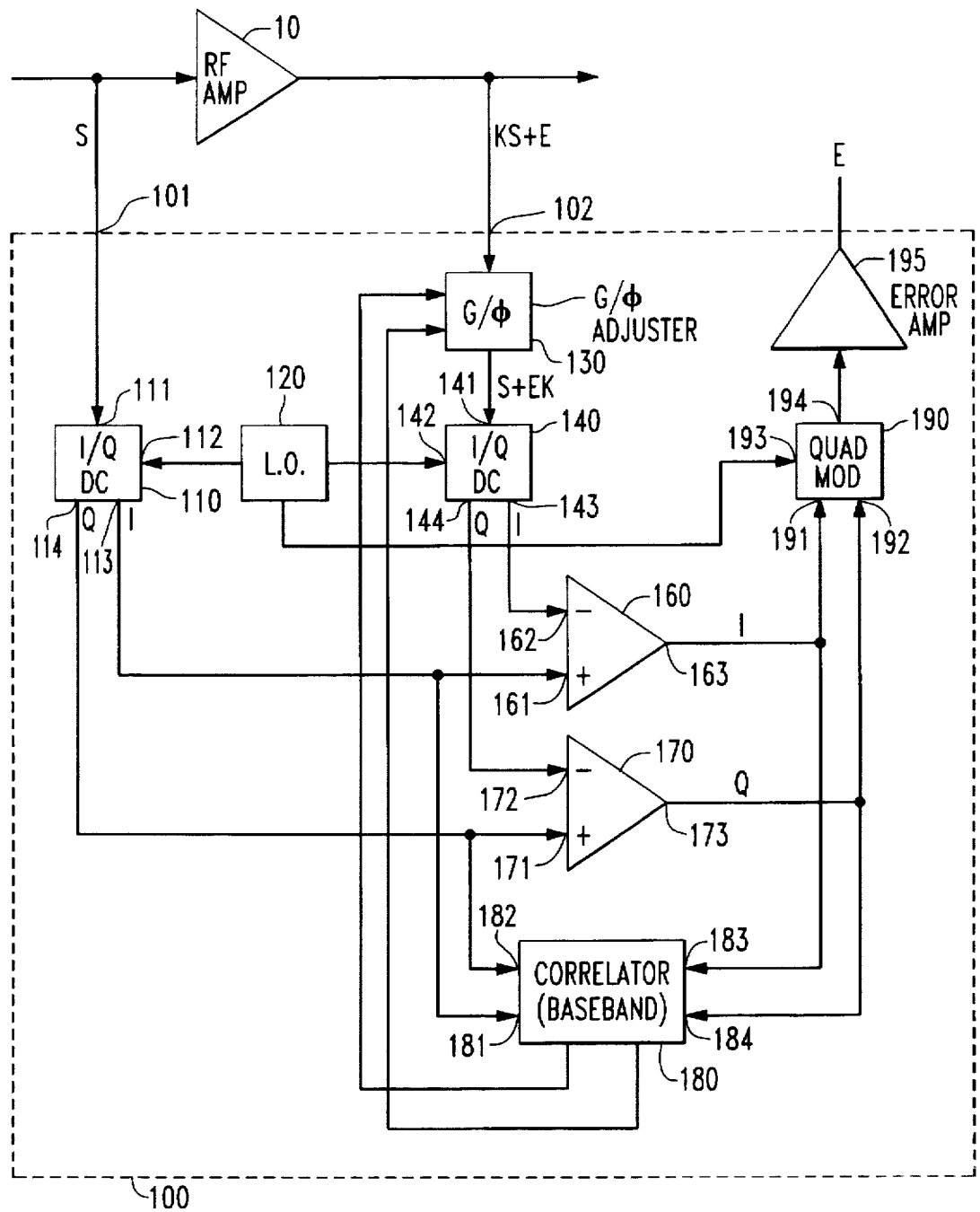
FIG. 4 diagrammatically illustrates the configuration of a baseband-referenced RF power amplifier distortion measurement system in accordance with a first embodiment of the present invention.

Referring now to FIG. 4, the configuration of a baseband-referenced RF power amplifier distortion measurement system in accordance with a first embodiment of the present invention is diagrammatically illustrated as being surrounded by broken lines 100, and comprising a first, input signal port 101, which is coupled to receive the RF input signal S applied to RF/microwave power amplifier 10 whose distortion-introducing behavior is to be measured. As in the previously described circuit configurations of FIGS. 1–3, RF power amplifier 10 has a gain of K, and generates an amplified RF output signal KS, plus an RF distortion or error signal component E, as an output signal KS+E which is applied to a second port 102 of the amplifier distortion measurement system 100.

The first input signal port 101 is coupled to a first input 111 of a first quadrature downconverter 110. This first quadrature downconverter 110 has a second input 112 to which the output of an RF local oscillator 120 is applied. First quadrature downconverter 110 is of conventional construction and includes a pair of in-phase and quadrature-phase mixers/multipliers, the outputs of which are coupled to a first in-phase (I) output 113 and a second quadrature (Q) output 114, from which respective I and Q components representative of the instantaneous amplitude and phase of a downconverted-to-baseband version of the input signal S are derived. The in-phase mixer of quadrature down-converter 110 is coupled to receive the local oscillator frequency produced by local oscillator 120, while the quadrature-phase mixer is coupled through a 90° phase shifter to the output of local oscillator 120.

Similarly, the second input signal port 102 is coupled through a conventional gain/phase adjusting circuit 130 to a first input 141 of a second quadrature downconverter 140. The gain/phase adjusting circuit 130 is operative to effectively scale the output signal KS+E to S+E/K prior to the (scaled) amplifier RF output signal being applied to the second quadrature downconverter 140, such that the magnitude and phase of the S component within the S+E/K exactly match those of the input signal S to the RF power amplifier 10. For this purpose a baseband correlator 180, to be described, is used to correlate the baseband-converted I and Q components of the original input signal S with a difference signal that ideally represents a baseband I and Q components of the scaled distortion/error in the RF output signal produced by the RF power amplifier 10, so as to generate a control signal for setting the control parameters of the gain/phase adjusting circuit 130.

The second quadrature downconverter 140 has a second input 142 to which the output of the local oscillator 120 is also applied. Local oscillator 120 is employed for each of quadrature down-converters 110 and 140, and also for a quadrature up-converter 190, which is operative to remodulate a baseband error signal back to RF, as will be described, so that all effects of any RF local oscillator frequency and phase imperfections are mutually canceled.

The second quadrature downconverter 140 has a first in-phase (I) output 143 and a second quadrature (Q) output 144 from which respective I and Q components representative of the instantaneous amplitude and phase of a downconverted-to-baseband version of the output signal KS+E are derived.

The in-phase component $S_I$ of the baseband converted input signal at the first output 113 of the first quadrature downconverter 110 and the in-phase component $(S+E/K)_I$ of the baseband converted output signal at the first output 143 of the second quadrature downconverter 140 are applied to respective complementary inputs 161 and 162 of a first, in-phase difference amplifier 160. The output 163 of in-phase difference amplifier 160 is representative of the in-phase component of the baseband-converted version of the error or distortion signal E produced by RF amplifier 10.

Similarly, the quadrature-phase component $S_Q$ of the baseband converted input signal at the second output 114 of the first quadrature downconverter 110 and the quadrature-phase component $(S+E/K)_Q$ of the baseband converted output signal at the second output 144 of the second quadrature downconverter 140 are applied to respective complementary inputs 171 and 172 of a second, quadrature-phase difference amplifier 170. The output 173 of quadrature-phase difference amplifier 170 is representative of the quadrature-phase component of the baseband-converted, 1/K scaled version of the error or distortion signal E produced by RF amplifier 10.

Since the signals upon which difference amplifiers 160 and 170 operate are baseband signals, conventional, relatively inexpensive differential amplifier components, whose transfer functions are extremely linear at baseband, may be employed, thereby obviating the distortion-augmentation behavior of RF components, such as the hard limiters of FIG. 3, described above.

The outputs 163 and 173 of the difference amplifiers 160 and 170 are respectively representative of the differences between the in-phase and quadrature components of the RF amplifier's input and (1/K scaled) output signals, so that these difference I and Q outputs at output ports 163 and 173 effectively represent the scaled error signal E. By correlating these scaled error signal components with those of the original input signal, the presence of any residual portion of the input signal S in the scaled output of the gain/phase adjustment circuit 130 can be measured, and used as a control signal for setting the parameters of gain/phase adjusting circuit 130, such that the value of scaling constant K is set to a value that will exactly remove such residual signal, and thereby enable difference amplifiers 160 and 170 to produce I and Q difference outputs that exactly represent a baseband version of the scaled error signal component E/K.

For this purpose, the respective in-phase and quadrature-phase components $S_I$ and $S_Q$ of the baseband converted input signal at the first and second outputs 113 and 114 of the first quadrature downconverter 110 are further applied to first inputs 181 and 182 of a baseband correlator 180. Baseband correlator 180 also has a third input 183 coupled to the difference output 163 of the in-phase difference amplifier 160, and a fourth input 184 coupled to difference output 173 of the quadrature-phase difference amplifier 170. The output of correlator 180 is fed back to gain/phase adjusting circuit 130, so that the scaling parameters imparted by gain/phase adjusting circuit 130 impart a scaling factor K to the RF power amplifier's output signal that will cause any residual component of the input signal S to be exactly removed by difference amplifiers 160 and 170, so that their respective baseband I and Q difference outputs contain only the scaled error signal component E/K.

The baseband I difference output 163 of the in-phase difference amplifier 160 and the baseband Q difference output 173 of the quadrature-phase difference amplifier 170 which contain only the in-phase and quadrature-phase components of the scaled error signal component E/K are further coupled to respective in-phase and quadrature inputs 191 and 192 of a quadrature modulator/up-converter 190. Like quadrature downconverters 110 and 140, quadrature modulator (up-converter) 190 is of conventional construction and also includes a pair of in-phase and quadrature-phase mixers/multipliers, the inputs of which are coupled to the first in-phase (I) input 191 and the second quadrature (Q) input 192, to which the respective baseband I and Q components representative of the amplitude and phase of the baseband (scaled) error signal are applied. Quadrature up-converter 190 has a third input 193 coupled to receive the output of local oscillator 120. The in-phase mixer of quadrature up-converter 190 is coupled to receive the local oscillator frequency produced by local oscillator 120, while its quadrature-phase mixer is coupled through a 90° phase shifter to the output of local oscillator 120. As a result, quadrature up-converter 190 is operative to produce an up-converted or remodulated RF signal at its output 194, that corresponds to the RF error component E of the RF output signal KS+E produced by RF power amplifier 10. The output 194 of up-converter 190 is coupled through an error amplifier 195 of a prescribed gain to produce the desired RF error signal E.

Figure 5:
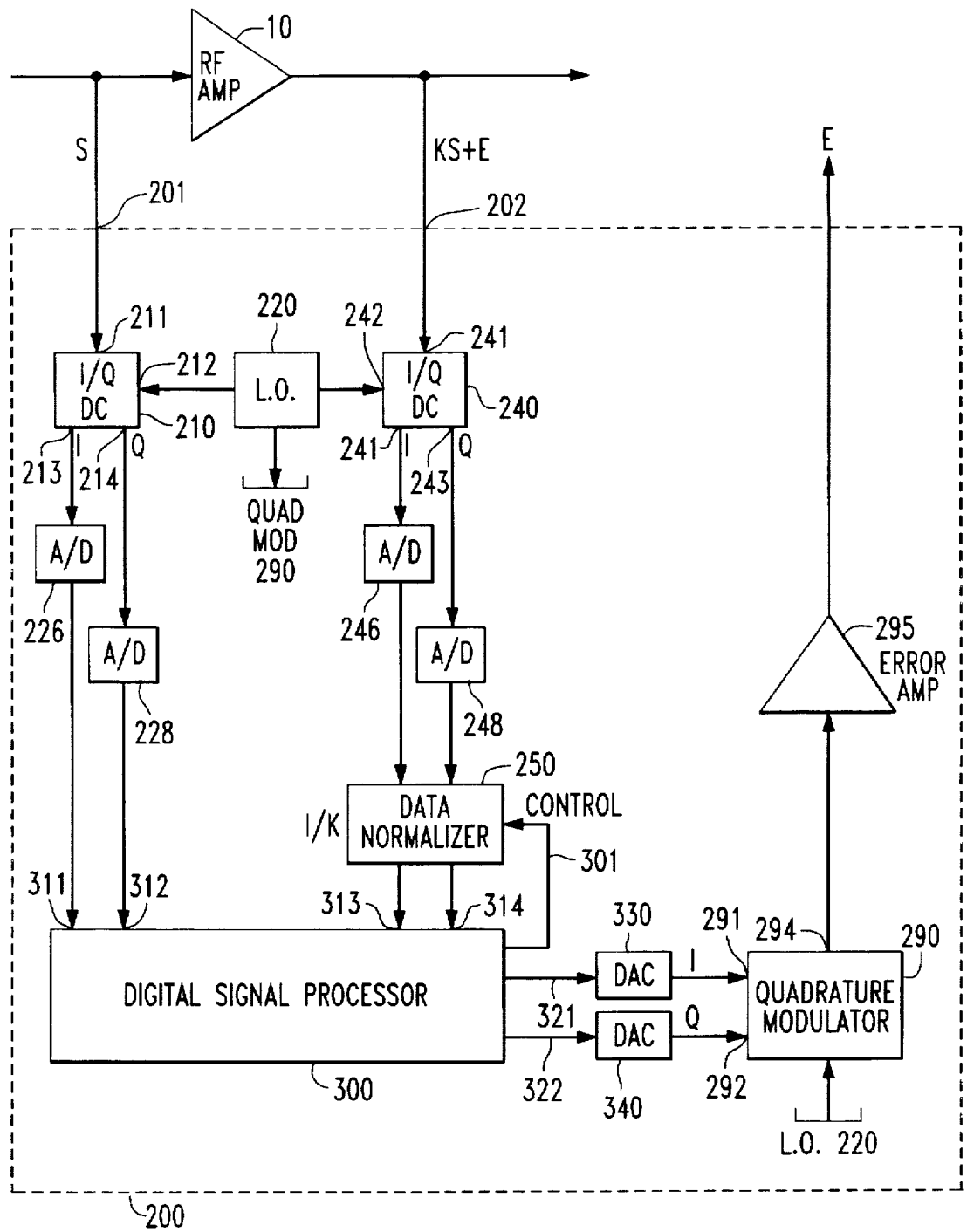
FIG. 5 diagrammatically illustrates a digital implementation of a baseband-referenced RF power amplifier distortion measurement system of the present invention.

FIG. 5 diagrammatically illustrates a digital implementation of a baseband-referenced RF power amplifier distortion measurement system of the present invention. Like the embodiment of FIG. 4, the digital embodiment, surrounded by broken lines 200, has a first, input signal port 201 coupled to receive the RF input signal S applied to RF/microwave power amplifier 10, and a second port 202 coupled to receive the RF output signal KS+E. Again, the first input signal port 201 is coupled to a first input 211 of a first quadrature downconverter 210, which has a second input 212 coupled to the output of an RF local oscillator 220. The in-phase and quadrature-phase mixers/multipliers within quadrature downconverter 210 produce respective in-phase (I) output and quadrature (Q) outputs respectively representative of the instantaneous amplitude and phase of the downconverted-to-baseband version of the input signal S. These I and Q baseband signal components are digitized by respective analog-to-digital converters (ADCs) 226 and 228 and the digitally quantized I and Q values of the baseband-converted input signal S are coupled to respective inputs 311 and 312 a digital signal processor (DSP) 300. Digital signal processor 300 is operative to perform the respective differencing and correlation functions carried out by difference amplifiers 160 and 170 and baseband correlator 180 of FIG. 4, described above.

Similarly, the second input signal port 202 is coupled to a first input 241 of a second quadrature downconverter 240, which has a second input 242 coupled to the output of the local oscillator 220. Again, as in the embodiment of FIG. 4, local oscillator 220 is employed for each of quadrature down-converters 210 and 240, and also for a quadrature up-converter 290, which remodulates the baseband error signal back to RF. As described above, using the same RF local oscillator for each up-conversion and down-conversion operation, effectively achieves mutual cancellation of all effects of any RF local oscillator frequency and phase imperfections. The second quadrature downconverter 240 has a first in-phase (I) output 241 and a second quadrature (Q) output 243 from which respective I and Q components representative of the instantaneous amplitude and phase of a downconverted-to-baseband version of the output signal KS+E are derived. The I and Q baseband signal components produced by the second quadrature down-converter 240 are digitized by respective analog-to-digital converters (ADCs) 246 and 248 and the digitally quantized I and Q values of the baseband-converted output signal KS+E are then coupled to a data normalizer 250, which is operative to controllably scale (normalize) the baseband-converted amplitude and phase values of the output signal for application to respective inputs 313 and 314 of DSP 300.

In addition to producing a normalization control signal on line 301 as a result of conducting the baseband correlation described previously, DSP 300 also produces a respective baseband I difference output on line 321 and a baseband Q difference output on line 322, which are converted into analog format by way of digital-to-analog converters (DACs) 330 and 340, respectively. As a result of baseband correlation controlled normalization of the baseband version of the amplifier's RF output signal, the outputs of DACs will contain only the scaled error signal component E/K. This scaled error signal component is coupled to respective in-phase and quadrature inputs 291 and 292 of a quadrature modulator/up-converter 290, which is configured identical to quadrature modulator (up-converter) 190 of the embodiment of FIG. 4, and is operative to produce an up-converted or remodulated RF signal at its output 294, which corresponds to the RF error component E of the RF output signal KS+E produced by the RF power amplifier 10. The output 294 of quadrature up-converter 290 is then coupled through an error amplifier 295 of a prescribed gain to produce the desired error signal E.

As will be appreciated from the foregoing description, the above described added distortion and component cost/complexity problems of prior art RF power amplifier measurement schemes are effectively obviated by the baseband down-conversion system of the present invention, which employs components that exhibit neither phase nor amplitude distortion behavior, in the course of converting the RF signals of interest (S and KS+E) to a lower frequency portion of the electromagnetic spectrum (baseband), so as to allow for the use of reduced cost, and relatively linear (baseband) signal processing components, and performing RF amplifier distortion measurements directly on the down-converted baseband signals.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of measuring amplitude and phase distortion of a microwave/RF power amplifier comprising the steps of:

(a) down-converting each of said microwave/RF power amplifier's input and amplified output signals to baseband signal components; and (b) performing RF amplifier distortion measurements on said down-converted baseband signal components produced in step (a), so as to extract a baseband error signal representative of said amplitude and phase distortion.

2. A method according to claim 1, wherein step (b) is carried out using digital signal processing.

3. A method according to claim 1, wherein step (a) comprises down-converting each of said microwave/RF power amplifier's input and amplified output signals to baseband quadrature-related signal components, and wherein step (b) comprises performing RF amplifier distortion measurements on said baseband quadrature-related signal components produced in step (a), to extract said baseband error signal representative of said amplitude and phase distortion.

4. A method according to claim 1, wherein step (a) comprises down-converting each of said microwave/RF power amplifier's input and amplified output signals to baseband in-phase (I) and quadrature (Q) signal components, and wherein step (b) comprises performing RF amplifier distortion measurements on said baseband I and Q components produced in step (a), to extract said baseband error signal representative of said amplitude and phase distortion.

5. A method according to claim 4, wherein step (a) includes the steps of:

(a1) down-converting said input signal to baseband by means of a first quadrature downconverter, thereby producing first in-phase (I) and quadrature-phase (Q) signal components representative of the instantaneous amplitude and phase of a downconverted-to-baseband version of said input signal, and (a2) scaling said RF output signal by means of a gain/phase adjusting circuit and down-converting said scaled RF output signal to baseband by way of a second quadrature downconverter, thereby producing second in-phase (I) and quadrature-phase (Q) signals representative of the instantaneous amplitude and phase of a downconverted-to-baseband version of said scaled RF output signal.

6. A method according to claim 5, wherein step (b) is carried out using digital signal processing.

7. A method according to claim 5, wherein step (b) includes the steps of:

(b1) deriving the difference between said first and second in-phase (I) signal components so as to produce a first baseband error output signal representative of the in-phase (I) component of the baseband-converted version of the distortion produced by said RF power amplifier, (b2) deriving the difference between said first and second quadrature-phase (Q) signal components so as to produce a second baseband error output signal representative of the quadrature-phase (Q) component of the baseband-converted version of the distortion produced by said RF power amplifier, said first and second baseband error output signals being representative of said amplitude and phase distortion.

8. A method according to claim 7, further including the step of:

(c) performing quadrature up-conversion of said first and second baseband error output signals to produce an up-converted RF signal that corresponds to the RF distortion component contained in the RF output signal produced by said RF power amplifier.

9. A method according to claim 8, wherein step (a2) comprises controlling the scaling of said RF output signal carried out by said gain/phase adjusting circuit in accordance with a baseband correlation of said first in-phase (I) and quadrature-phase (Q) signal components with said first and second baseband error output signals.

10. A signal processing apparatus for measuring amplitude and phase distortion of a microwave/RF power amplifier comprising:

down-conversion circuitry which is operative to down-convert each of said microwave/RF power amplifier's input and amplified output signals to baseband signal components; and baseband error measurement signal processing circuitry which is operative to perform RF amplifier distortion measurements on said down-converted baseband signal components to extract a baseband error signal representative of said amplitude and phase distortion.

11. A signal processing apparatus according to claim 10, wherein said baseband error measurement signal processing circuitry includes a digital signal processor.

12. A signal processing apparatus according to claim 10, wherein said down-conversion circuitry includes gain/phase adjusting circuit which is operative to scale said microwave/RF power amplifier's amplified output signal by a factor corresponding to the gain of said microwave/RF power amplifier.

13. A signal processing apparatus according to claim 12, wherein said baseband error measurement signal processing circuitry includes a baseband correlator which is operative to correlate said down-converted baseband input signal with said baseband error signal, and producing a control signal for said gain/phase adjusting circuit.

14. A signal processing apparatus according to claim 10, further including up-conversion circuitry which is operative to perform up-conversion of said baseband error signal to produce an up-converted RF signal that corresponds to the RF distortion component contained in the RF output signal produced by said RF power amplifier.

15. A signal processing apparatus according to claim 10, wherein said down-conversion circuitry is operative to down-convert each of said microwave/RF power amplifier's input and amplified output signals to baseband quadrature-related signal components, and wherein said baseband error measurement signal processing circuitry is operative to perform RF amplifier distortion measurements on said baseband quadrature-related signal components to extract said baseband error signal representative of said amplitude and phase distortion.

16. A signal processing apparatus according to claim 10, wherein said down-conversion circuitry is operative to down-convert each of said microwave/RF power amplifier's input and amplified output signals to baseband in-phase (I) and quadrature (Q) signal components, and wherein said baseband error measurement signal processing circuitry is operative to perform RF amplifier distortion measurements on said baseband I and Q components to extract said baseband error signal representative of said amplitude and phase distortion.

17. A signal processing apparatus according to claim 16, wherein said down-conversion circuitry comprises a first quadrature downconverter, which produces first in-phase (I) and quadrature-phase (Q) signal components representative of the instantaneous amplitude and phase of a downconverted-to-baseband version of said input signal, a gain/phase adjusting circuit which is operative to scale said RF output signal, and a second quadrature downconverter, which is operative to down-convert said scaled RF output signal to baseband, thereby producing second in-phase (I) and quadrature-phase (Q) signals representative of the instantaneous amplitude and phase of a downconverted-to-baseband version of said scaled RF output signal.

18. A signal processing apparatus according to claim 17, wherein said baseband error measurement signal processing circuitry includes difference circuitry which is operative to derive the difference between said first and second in-phase (I) signal components so as to produce a first baseband error output signal representative of the in-phase (I) component of the baseband-converted version of the distortion produced by said RF power amplifier, and to derive the difference between said first and second quadrature-phase (Q) signal components so as to produce a second baseband error output signal representative of the quadrature-phase (Q) component of the baseband-converted version of the distortion produced by said RF power amplifier, said first and second baseband error output signals being representative of said amplitude and phase distortion.

19. A signal processing apparatus according to claim 18, further including up-conversion circuitry which is operative to perform quadrature up-conversion of said first and second baseband error output signals to produce an up-converted RF signal that corresponds to the RF distortion component contained in the RF output signal produced by said RF power amplifier.

20. A signal processing apparatus according to claim 18, wherein said baseband error measurement signal processing circuitry includes a baseband correlator which is operative to correlate said first in-phase (I) and quadrature-phase (Q) signal components with said first and second baseband error output signals, and producing a control signal for said gain/phase adjusting circuit.

* * * * *